(12) United States Patent
Lim et al.

(10) Patent No.: US 8,384,407 B2
(45) Date of Patent: Feb. 26, 2013

(54) TEST PAD STRUCTURE, A PAD STRUCTURE FOR INSPECTING A SEMICONDUCTOR CHIP AND A WIRING SUBTRATE FOR A TAPE PACKAGE HAVING THE SAME

(75) Inventors: So-Young Lim, Hwaseong-si (KR); Sang-Heul Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 468 days.

(21) Appl. No.: 12/457,775

(22) Filed: Jun. 22, 2009

(65) Prior Publication Data
US 2009/0322362 A1    Dec. 31, 2009

(30) Foreign Application Priority Data
Jun. 25, 2008    (KR) .................. 10-2008-0060345

(51) Int. Cl.
*G01R 31/26* (2006.01)
*G01R 31/02* (2006.01)
(52) U.S. Cl. .............................. 324/760.01; 324/762.04
(58) Field of Classification Search .................. None
See application file for complete search history.

(56) References Cited

U.S. PATENT DOCUMENTS

| | | | |
|---|---|---|---|
| 6,300,997 B1 * | 10/2001 | Saito et al. | 349/149 |
| 6,483,042 B2 | 11/2002 | Yamashita | |
| 7,164,460 B2 * | 1/2007 | Hagiwara | 349/149 |
| 2006/0175713 A1 * | 8/2006 | Aramatsu | 257/786 |

FOREIGN PATENT DOCUMENTS

| | | |
|---|---|---|
| JP | 2006-228761 | 8/2006 |
| KR | 10-0439128 | 6/2004 |

OTHER PUBLICATIONS

An English language abstract of Korean Publication No. 10-2003-0082120, published Oct. 22, 2003.

* cited by examiner

*Primary Examiner* — Roberto Velez
(74) *Attorney, Agent, or Firm* — Harness, Dickey & Pierce, P.L.C.

(57) ABSTRACT

A test pad structure may include a plurality of test pads and a plurality of connection leads. A plurality of the test pads may be sequentially arranged from a wiring pattern on a substrate and arranged in rows parallel with one another. The plurality of the test pads may include a first group of test pads having at least one pad arranged in a first row and a second group of test pads having at least two pads. A plurality of the connection leads may extend from end portions of the wiring pattern to be connected to the plurality of test pads. A plurality of the connection leads may include at least one inner lead passing between the at least two pads of the second group of the test pads arranged in a second row closest to the first group of the test pads. The at least one inner lead may be connected to at least one pad of the at least two pads of the second group of the test pads arranged in a third row next to the second row.

16 Claims, 5 Drawing Sheets

TEST PAD STRUCTURE, A PAD STRUCTURE FOR INSPECTING A SEMICONDUCTOR CHIP AND A WIRING SUBTRATE FOR A TAPE PACKAGE HAVING THE SAME

PRIORITY STATEMENT

This application claims priority under 35 U.S.C. §119 to Korean Patent Application No. 2008-60345, filed on Jun. 25, 2008 in the Korean Intellectual Property Office (KIPO), the entire contents of which are herein incorporated by reference.

BACKGROUND

1. Field

Example embodiments relate to a test pad structure, a pad structure for inspecting a semiconductor chip and a wiring substrate for a tape package having the same. More particularly, example embodiments relate to a test pad structure for inspecting a semiconductor chip mounted on a wiring substrate and a wiring substrate for a tape package having the same.

2. Description of the Related Art

Generally, semiconductor devices are manufactured by a fab process for forming electrical circuits including electrical elements on a semiconductor substrate, e.g., a silicon wafer, an electrical die sorting (EDS) process for inspecting electrical properties of chips formed by the fab process, and a packaging process for sealing the chips with resin, e.g., epoxy, and sorting the chips.

Through the packaging process, the semiconductor device, e.g., a semiconductor chip, is electrically connected to a mounting substrate, and the semiconductor chip is sealed to be protected from the outside. The semiconductor package including the semiconductor chip mounted on the mounting substrate dissipates heat from the semiconductor chip outside through cooling functions thereof. For example, methods of electrically connecting the semiconductor chip to the mounting substrate may include a wire bonding process, a solder bonding process, and/or a tape automated bonding (TAB) process.

The manufacturing industry for tape packages, which are used as driver integrated circuit (IC) components for flat-panel displays (FPDs), owes its growth to the development of the manufacturing industry for FPDs, e.g., liquid crystal displays (LCDs). A tape package is a semiconductor package using a tape substrate. The tape package may be classified as either a tape carrier package (TCP) or a chip-on-film (COF) package.

Generally, input/output (I/O) wiring patterns formed on the tape substrate may be used as external connection terminals in the TAB process. The I/O wiring patterns are directly adhered to a printed circuit board (PCB) or a display panel to manufacture the tape package.

In manufacturing of the tape package, an inspection process may be performed to inspect electrical properties of the semiconductor chip mounted on the tape substrate. In particular, probe needles of a probe card make contact with test pads formed on the tape substrate to inspect the semiconductor chip. The test pads are electrically connected to the I/O wiring patterns through connection leads. The test pads are spaced apart from one another by a predetermined or given distance, and the probe needles make contact with the corresponding test pads.

Recently, as the number of input/output signal lines for the semiconductor chip is increased, dimensions of the tape substrate for mounting the semiconductor chip and line widths between the wiring patterns are reduced. Accordingly, because spaces between the test pads are reduced together, thicknesses of the probe needles are required to be reduced. However, the probe needles need to have the minimum allowable thickness for reliability and endurance thereof, and thus, a test pad structure having a structure suitable for the probe card currently produced in large quantities is required.

SUMMARY

Example embodiments provide a pad structure for inspecting a semiconductor chip including test pads arranged to be configured to provide the maximum sizes and pitches on a reduced wiring substrate. Example embodiments provide a wiring substrate for a tape package including the pad structure for inspecting a semiconductor chip.

According to example embodiments, a test pad structure may include a plurality of test pads and a plurality of connection leads. A plurality of the test pads may be sequentially arranged from a wiring pattern on a substrate and arranged in rows parallel with one another. The plurality of the test pads may include a first group of test pads having at least one pad arranged in a first row and a second group of test pads having at least two pads. A plurality of the connection leads may extend from end portions of the wiring pattern to be connected to the plurality of test pads. A plurality of the connection leads may include at least one inner lead passing between the at least two pads of the second group of the test pads arranged in a second row closest to the first group of the test pads. The at least one inner lead may be connected to at least one pad of the at least two pads of the second group of the test pads arranged in a third row next to the second row.

In example embodiments, at least two pads of the second group arranged in the second row have a first plane area, and the at least two pads of the second group in the third row have a second plane area greater than the first plane area. In example embodiments, the second group of the test pads are arranged to be symmetric with respect to a middle line that extends in the direction where the first group of the test pads are arranged. In example embodiments, the at least one inner lead may include a folded portion inclined from the direction where the first group of the test pads are arranged, the folded portion passing between the first group of the test pads and the pad of the second group of the test pads arranged in the second row.

In example embodiments, the at least two pads of the second group arranged in the second row are spaced apart from each other by the minimum space required for the at least one inner lead. The plurality of test pads are arranged in six rows. In example embodiments, the test pad structure may further include a semiconductor chip mounted on the substrate, wherein the wiring pattern is connected to at least one of input and output pads of the semiconductor chip. In example embodiments, the semiconductor chip may include a driving circuit for driving a display device.

According to example embodiments, a pad structure for inspecting a semiconductor chip may include a plurality of test pads on a substrate having a semiconductor chip mounted thereon, the plurality of the test pads including a first group of test pads having at least one pad arranged in a first row and a second group of test pads having at least two first pads and at least two second pads, the at least two first pads arranged in a second row parallel with the first row, and the at least two second pads arranged in a third row parallel with the first row; and a plurality of connection leads on the substrate to connect the plurality of test pads to at least one of input and output pads of the semiconductor chip, the plurality of the connection leads including a first group of connection leads connected to the first group of the test pads and a second group of connection leads having first leads and second leads, the first leads connected to the at least two first pads, and at least one second lead passing between the at least two first pads to be connected to at least one of the at least two second pads.

In example embodiments, the at least two first pads have a first plane area, and the at least two second pads have a second plane area greater than the first plane area. In example embodiments, the at least two first pads are spaced apart from each other by a space required for the at least one second lead. In example embodiments, the first group of the test pads may further include two test pads arranged in rows parallel with the first row, and the second group of the test pads may further include at least two third pads arranged in a fourth row parallel with the first row.

In example embodiments, the second group of the connection leads may further include a second lead passing between the at least two first pads to be connected to any one of the at least two second pads and a third lead passing between the at least two first pads to be connected to any one of the at least two third pads. In example embodiments, the second group of the test pads are arranged to be symmetric with respect to a middle line that extends in the direction where the first group of the test pads are arranged.

In example embodiments, each of the second and third leads may include a folded portion inclined from the direction where the first group of the test pads are arranged, the folded portion passing between the first group of the test pads and the at least one pad of the second group of pads arranged in the second row. In example embodiments, the at least two first pads have a first plane area, the at least two second pads have a second plane area greater than the first plane area and the at least two third pads have a third plane area greater than the second plane area. In example embodiments, the first, second and third rows are substantially perpendicular to a direction where the plurality of test pads are arranged. In example embodiments, the plurality of the test pads forms a single block and a plurality of the blocks is arranged in a direction perpendicular to the direction where the test pads are arranged.

According to example embodiments, a wiring substrate for a tape package may include a base film, a wiring pattern, and the test pad structure of example embodiments. The base film may include a chip-mounting region, the chip-mounting region configured to mount a semiconductor chip thereon. A wiring pattern extends from the chip-mounting region to outside the chip-mounting region and is configured to electrically connect to the semiconductor chip.

Accordingly, the pads arranged in the first row may be formed to have the possible maximum size and be spaced apart from each other by a space between which the at least one inner lead may pass. Thus, the semiconductor chip may be inspected reliably without decreasing sizes and pitches for the probe needles of the probe card.

BRIEF DESCRIPTION OF THE DRAWINGS

Example embodiments will be more clearly understood from the following detailed description taken in conjunction with the accompanying drawings.

FIG. 1 is a plan view illustrating a wiring substrate for a tape package in accordance with example embodiments.

FIG. 2 is a plan view illustrating a test pad structure for inspecting a semiconductor chip in accordance with example embodiments.

FIG. 3 is an enlarged plan view illustrating "A" portion in FIG. 2.

FIG. 4 is a plan view illustrating a test pad structure for inspecting a semiconductor chip in accordance with example embodiments.

FIG. 5 is a plan view illustrating a display device manufactured using a wiring substrate for a tape package in accordance with example embodiments.

DETAILED DESCRIPTION OF EXAMPLE EMBODIMENTS

Figure 1:
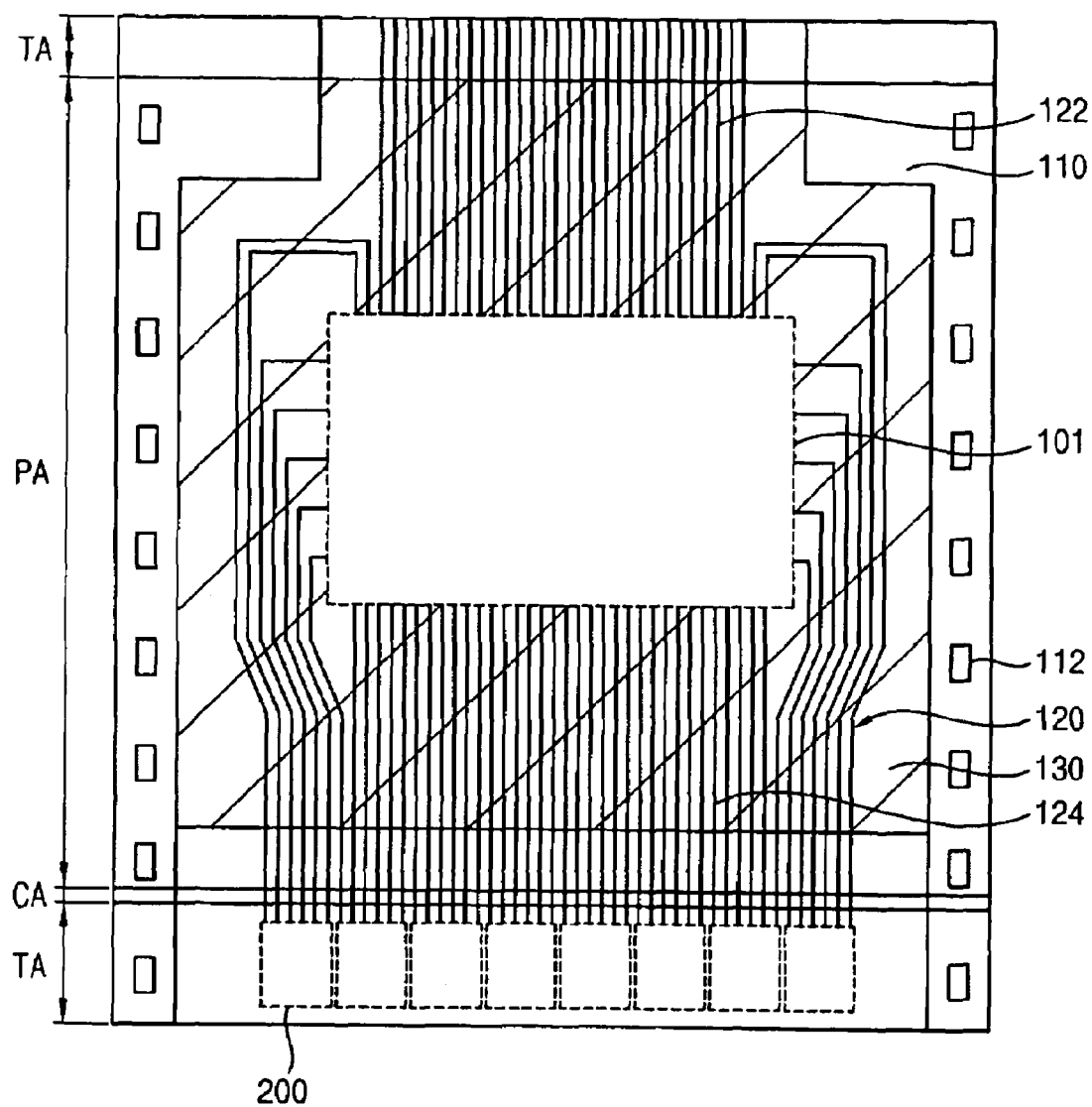
FIGS. 1 to 5 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a plan view illustrating a wiring substrate for a tape package in accordance with example embodiments. Referring to FIG. 1, a wiring substrate 100 for a tape package may include a substrate for mounting a semiconductor chip (not illustrated), a wiring pattern 120 and a test pad structure (not illustrated) for inspecting the semiconductor chip.

In example embodiments, the substrate may include a base film 110 having an organic material, e.g., polyimide. For example, the base film 100 may be a flexible organic film. A chip-mounted region 101 where the semiconductor chip is mounted may be provided in the middle of the base film 110.

The base film 100 may include a package region PA where the semiconductor chip is mounted, an input/output test pad region TA provided in both sides of the package region PA and a cutting region CA for separating the package region PA from the input/output test pad region TA.

Sprocket holes 112 may be positioned along two opposite edges of the base film 110. The sprocket holes 112 may be spaced apart from one another. In a manufacture of a tape package, the sprocket hole 112 may be used for position calibration of the package region PA and movement of the base film 110. After the semiconductor is mounted on the base film 110, two opposite edges of the base film 110 having the sprocket holes 112 may be removed.

For example, after a metal thin film may be adhered to a surface of the base film 110 by an electrodeposition or thermocompression process, a photolithography process and an etch process may be performed on the metal thin film to form the wiring pattern 120. Examples of the metal may be copper (Cu), gold (Au), tin (Sn), lead (Pb), silver (Ag), and/or nickel (Ni). Additionally, other conductive material may be formed on the wiring pattern 120 by an electroplating process.

Input wirings 122 and output wirings 124 may extend in a first direction. Although it is not illustrated, the input wirings 122 and the output wirings 124 may include connection end portions to be adhered to bumps of the semiconductor chip. Accordingly, the connection end portions of the input and output wirings 122 and 124 may be respectively connected to input and output pads of the semiconductor chip.

In example embodiments, an insulation member 130 may be partially coated on the wiring pattern 120. The insulation member 130 may cover portions of the input wiring 122 and the output wiring 124 outside the chip-mounted region 101. For example, the insulation member 130 may include a solder resist.

The test pad structure 200 for inspecting the semiconductor chip may be formed in the test pad region TA of the base film 110. In example embodiments, a plurality of the pad structures 200 may be arranged in a second direction substantially perpendicular to the first direction.

Test pads 201 (see FIG. 2) of the test pad structure 200 may be electrically connected to the input and output pads of the semiconductor chip through the wiring pattern 120. Probe needles of a probe card may make contact with the test pads to inspect electrical properties of the semiconductor chip mounted on the base film 110.

Figure 2:
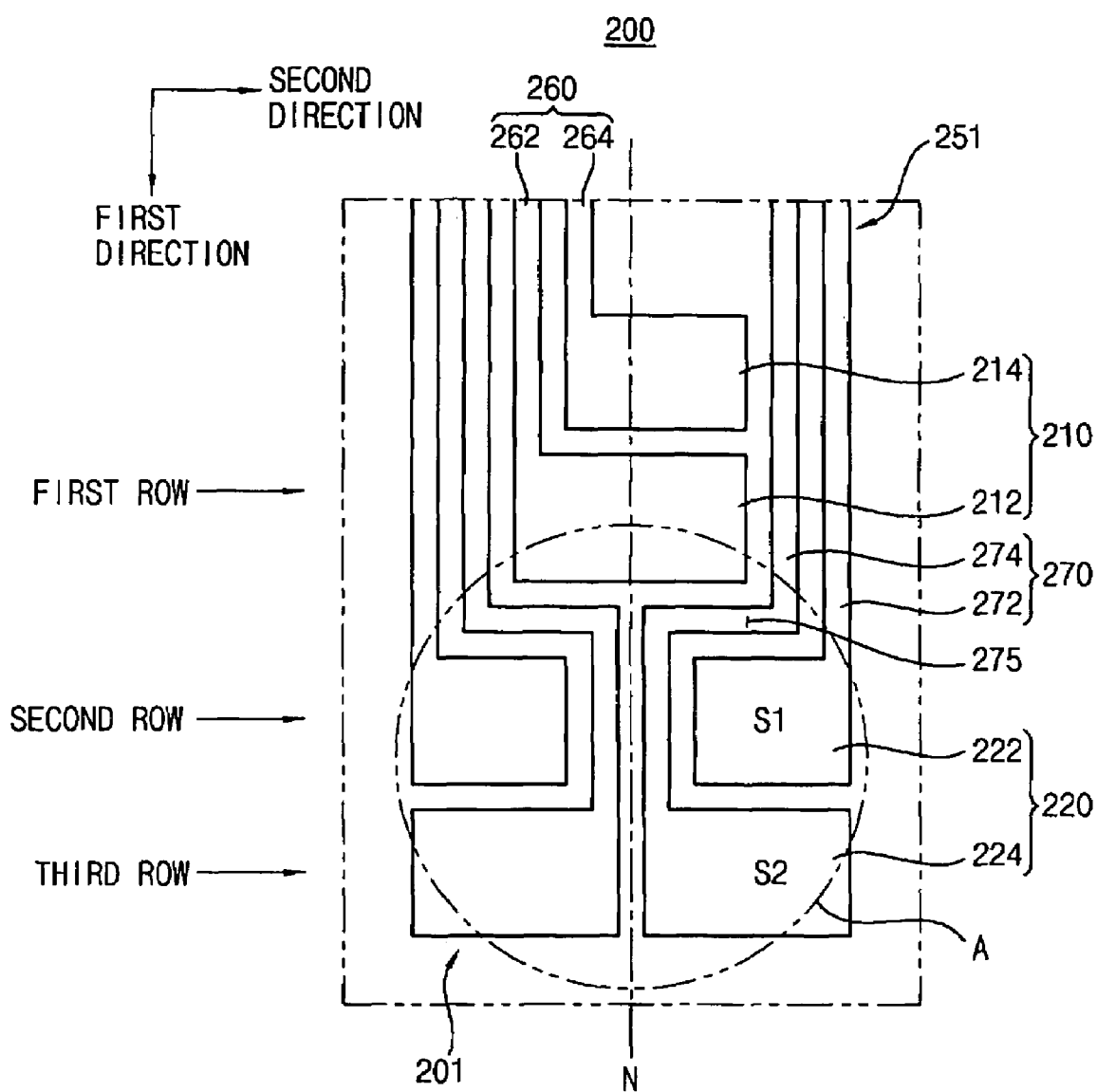
Figure 3:
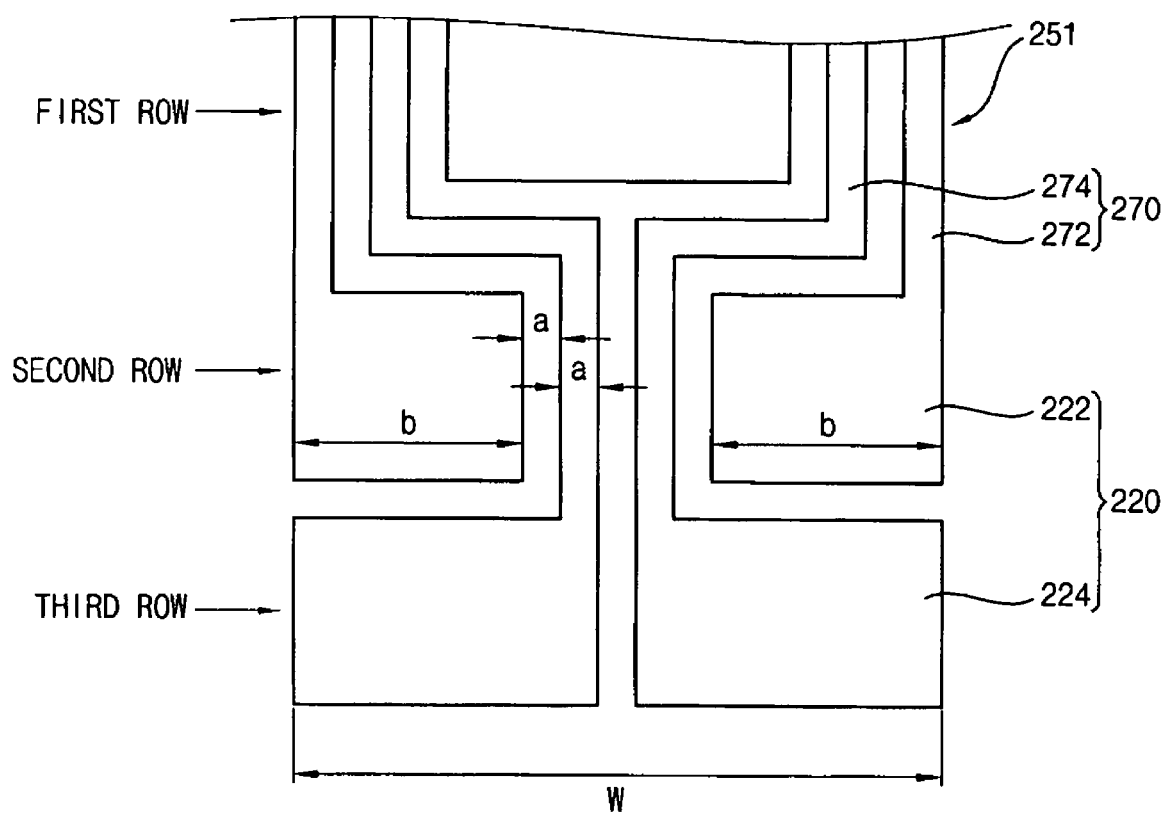

FIG. 2 is a plan view illustrating a test pad structure for inspecting a semiconductor chip in accordance with example embodiments. FIG. 3 is an enlarged plan view illustrating "A" portion in FIG. 2.

Referring to FIGS. 1 to 3, the test pad structure 200 may include a plurality of test pads 201 and a plurality of connection leads 251 in the test pad region TA of the base film 110. The connection leads 251 may connect the test pads 201 to the wiring pattern 120 on the base film 110.

A plurality of test pads 201 may be formed in the test pad region TA of the base film 110. For example, the test pad 201 may have a polygonal shape, e.g., a quadrangle. In example embodiments, a plurality of the test pads 201 may include a first group of test pads 210 and a second group of test pads 220. A plurality of the test pads 201 may be sequentially arranged in the first direction from the chip-mounted region 101. The first group of the test pads 210 may be positioned relatively more adjacent to the chip-mounted region 101. The second group of the test pads 220 may be positioned relatively farther away from the chip-mounted region 101.

The test pads 201 may be respectively arranged in rows parallel with the second direction. The first group of the test pads 210 may include a first pad 212 arranged in a first row relatively more adjacent to the chip-mounted region 101 and at least one second pad 214 arranged in another row parallel with the first row. The first group of the test pads 210 may be sequentially arranged in the first direction.

The second group of the second pads 220 may include at least two first pads 222 and at least two second pads 224. The first pads 222 may be arranged in a second row parallel with the first row. The second pads 224 may be arranged in a third row parallel with the first row. The second row may be most adjacent to the first group of the test pads 210. The third row may be next to the second row far away from the first group of the test pads 210.

In example embodiments, the second group of the test pads 220 may be arranged to be symmetric with respect to a middle line N that extends in the direction where the first group of the test pads 210 are arranged. In example embodiments, a plurality of the connection leads 251 may include a first group of the connection leads 260 and a second group of the connection leads 270.

A plurality of the connection leads 251 may extend from end portions of the wiring pattern 120 to be connected to a plurality of the test pads 201 respectively. A plurality of the connection leads 251 may extend in the first direction from the test pads 201. An end portion of the connection lead 251 may be connected to the test pad 201 and the other end portion of the connection lead 251 may be connected to the wiring pattern 120.

The first group of the connection leads 260 may be connected to the first group of the test pads 210. The pad 212 of the first group of the test pads 210 arranged in the first row may be electrically connected to the wiring pattern 120 through the first group of the connection leads 262. The pad 214 of the first group of the test pads 210 arranged in the row parallel with the first row may be electrically connected to the wiring pattern 120 through the second group of the connection leads 264.

The second group of the connection leads 270 may include first leads 272 and second leads 274. The first lead 272 may be connected to the first pad 222. The second lead 274 may be connected to the second pad 224. The first lead 272 may be arranged in the outermost region. Accordingly, the outermost first lead 272 may be an outer lead. The second lead 274 may be arranged between the first leads 272. The second lead 274 arranged between the outer leads may be an inner lead.

The second lead 274 may extend between the first pads 222 of the second group of the test pads 220 that are arranged in the second row most adjacent to the first group of the test pads 210, to be connected to the second pad 224 that is arranged in the third row next to the second row. Accordingly, the second lead 274 may be arranged to pass through a space between the first pads 222. Therefore, two second leads 274 may pass between the first pads 222.

Alternatively, although it is not illustrated, one of the second leads 274 may be the outer lead to be arranged in the outermost region and the other of the second leads 274 may be the inner lead to be arranged to extend between the first pads 222. Thus, only one of the second leads 274 may pass between the first pads 222.

In example embodiments, the second lead 274 may include a folded portion 275. The folded portion 275 may be inclined from the direction where the first group of the test pads 210 are arranged. The folded portion 275 may pass between the first group of the test pad 210 and the first pad 222 arranged in the second row.

For example, the second lead 274 may pass between the first pads 222. The second lead 274 may include the folded portion 275 that is inclined to the second direction perpendicular to the first direction. Thus, the folded portion 275 may provide layout of the test pads having a reliable arrangement for contact with the probe needles of the probe card.

In example embodiments, the first pad 222 may have a first plane area S1, and the second pad 224 may have a second plane area S2 greater than the first plane area S1. The second lead 274 may pass between the two first pads 222 having a minimum plane area. Accordingly, although the test pads 201 have fine pitches, the test pad structure 200 may maximize the areas of the test pads 201 and provide layout suitable for current probe card technologies.

Hereinafter, dimensions of the test pad structure will be explained in detail with reference to FIG. 3. Referring to FIG. 3, a space between the adjacent connection leads 251 or a space between the connection lead 251 and the adjacent test pad 201 (hereinafter, referred to as 'a') may be determined by accuracy in forming the wiring pattern 120. A minimum width (hereinafter, referred to as 'W') may determined by accuracy in positioning the probe needles of the probe card.

In example embodiments, the minimum width W of the test pad structure 200 may be calculated as follows. The width of the first pad 222 arranged in the second row is b.

$$W=5a+2b$$

Accordingly, the space between the first pads 222 is 5a. On the contrary, in a case of a test pad structure where the minimum width thereof is the same as that of the test pad structure 200 according to example embodiments and the second leads pass outside the first pads, not between the first pads, the space between the first pads is a. Therefore, the space between the first pads 222 of the test pad structure according to example embodiments may be increased by more than the spaces between the inner leads.

In example embodiments, the first leads 272 connected to the first pads 222 in the second row may be arranged in the outermost region. The second lead 274 connected to the second pads 224 in the third row may pass between the first pads 222. Accordingly, the first pads 222 may be formed to have the possible maximum size and be spaced apart from each other by a space between which the two connection leads 274 may pass. Thus, the semiconductor chip may be inspected reliably using the test pad structure 200 without decreasing sizes and pitches for the probe needles of the probe card.

In example embodiments, the test pad structure 200 may include total six test pads 201. The six test pads 201 may form a single block. A plurality of the blocks may be repeatedly arranged in the second direction perpendicular to the first direction.

Figure 4:
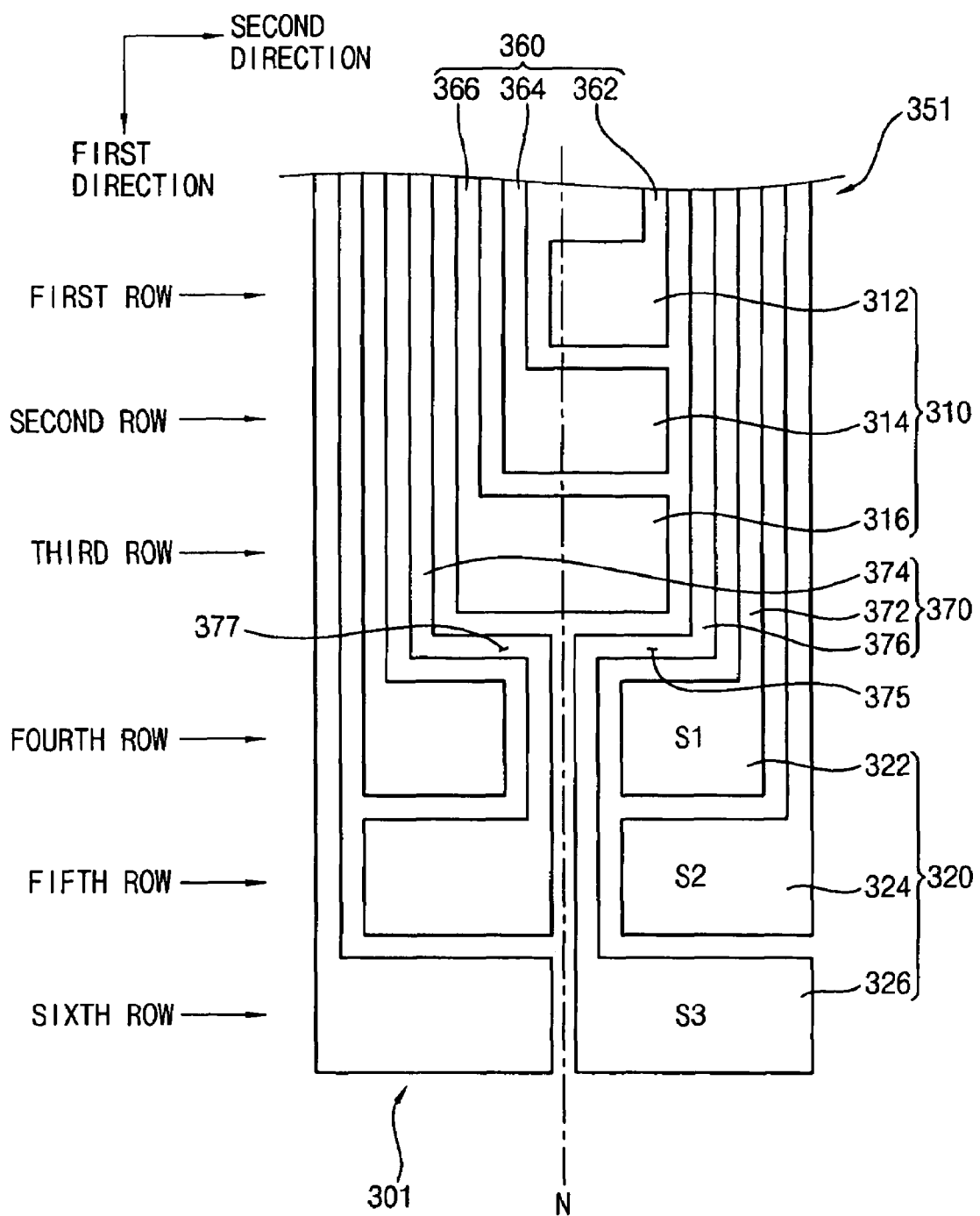

FIG. 4 is a plan view illustrating a test pad structure for inspecting a semiconductor chip in accordance with example embodiments. The test pad structure of example embodiments may be substantially the same as in the embodiment of FIG. 2, except for the number of the test pads and layout thereof.

Referring to FIGS. 1 and 4, the test pad structure according to example embodiments may include a plurality of test pads 301 and a plurality of connection leads 351 in the test pad region TA of the base film 110. The connection leads 351 may connect the test pads 301 to the wiring pattern 120 on the base film 110.

In example embodiments, a plurality of the test pads 301 may include a first group of test pads 310 and a second group of test pads 320. A plurality of the test pads 301 may be sequentially arranged in the first direction from the chip-mounted region 101 and respectively arranged in rows parallel with one another. The first group of the test pads 310 may be positioned relatively more adjacent to the chip-mounted region 101. The second group of the test pads 320 may be positioned relatively farther away from the chip-mounted region 101.

The first group of the test pads 310 may include three pads, e.g., first pad 312, second pad 314 and third pad 316 respectively arranged in first, second and third rows relatively more adjacent to the chip-mounted region 101. The first group of the test pads 310 may be sequentially arranged in the first direction.

The second group of the second pads 320 may include at least two first pads 322, at least two second pads 324 and at least two third pads 326. The first pads 322 may be arranged in a fourth row parallel with the first row. The second pads 324 may be arranged in a fifth row parallel with the first row. The third pads 326 may be arranged in a sixth row parallel with the first row. Thus, the first, second and third pads 322, 324 and 326 may be sequentially arranged in the first direction from the first group of the test pads 310.

In example embodiments, the second group of the test pads 320 may be arranged to be symmetric with respect to a middle line N that extends in the direction where the first group of the test pads 210 are arranged. In example embodiments, a plurality of the connection leads 351 may include a first group of the connection leads 360 and a second group of the connection leads 370.

A plurality of the connection leads 351 may extend from end portions of the wiring pattern 120 to be connected to a plurality of the test pads 301 respectively. A plurality of the connection leads 351 may extend in the first direction from the test pads 301. An end portion of the connection lead 351 may be connected to the test pad 301 and the other end portion of the connection lead 351 may be connected to the wiring pattern 120.

The first group of the connection leads 360 may be connected to the first group of the test pads 310, respectively. The pad 312 of the first group of the test pads 310 arranged in the first row may be electrically connected to the wiring pattern 120 through the first group of the connection leads 360, e.g., first connection lead 362. The pad 314 of the first group of the test pads 310 arranged in the second row may be electrically connected to the wiring pattern 120 through the first group of the connection leads 360, e.g., second connection lead 364. The pad 316 of the first group of the test pads 310 arranged in the third row may be electrically connected to the wiring pattern 120 through the first group of the connection leads 360, e.g., third connection lead 366.

The second group of the connection leads 370 may include first leads 372, second leads 374 and third leads 376. The first lead 372 may be connected to the first pad 322. The second lead 374 may be connected to the second pad 324. The third lead 376 may be connected to the third pad 326.

The second lead 374 may pass between the first pads 322 of the second group of the test pads 320 that are arranged in the fourth row most adjacent to the first group of the test pads 310, to be connected to the second pad 324 that is arranged in the fifth row next to the fourth row. Accordingly, the second lead 374 may be the inner lead arranged further inside.

The third lead 376 may pass between the first pads 322 of the second group of the test pads 320 that are arranged in the fourth row most adjacent to the first group of the test pads 310, thereby to be connected to the third pad 326 that is arranged in the sixth row next to the fifth row. Accordingly, the third lead 376 may be the inner lead to be arranged between the outer leads.

Accordingly, the second lead 374 extending from the second pad 324 may be arranged to pass through a space between the first pads 322. The third lead 376 extending from the third pad 376 may be arranged to pass between the first pads 322.

Alternatively, although it is not illustrated, two leads connected to the two second pads 324 may be arranged to pass between the first pads 322 and two leads connected to the two third pads 326 may be arranged in the outermost region. On the contrary, two leads connected to the two third pads 326 may be arranged to pass between the first pads 322 and between the second pads 324, and two leads connected to the two second pads 324 may be arranged in the outermost region.

In example embodiments, the second and third leads 374 and 376 may include folded portions 375 and 377, respectively. The folded portions 375 and 377 may be inclined from the direction where the first group of the test pads 310 are arranged. The folded portions 375 and 377 may pass between the first group of the test pad 310 and the first pad 322 arranged in the fourth row.

For example, the second lead 374 passing between the first pads 322 may include the folded portion 375 that is inclined to the second direction perpendicular to the first direction. The third lead 376 passing between the first pads 322 and between the second pads 324 may include the folded portion 377 that is inclined to the second direction perpendicular to the first direction.

Thus, the folded portions 375 and 377 of the second and third leads 374 and 376 may provide layout of the test pads having a reliable arrangement for contact with the probe needles of the probe card. In example embodiments, the first pad 322 may have a first plane area S1, the second pad 324 may have a second plane area S2 greater than the first plane area S1, and the third pad 326 may have a third plane area S3 greater than the second plane area S2.

Accordingly, the first pads 322 arranged in the fourth row may be spaced apart from each other to have the maximum pitch such that the second lead 374 and the third lead 376 pass between the first pads 322. The second pads 324 arranged in the fifth row may be spaced apart from each other to have the maximum pitch such that the third lead 376 passes between the second pads 324. Thus, the semiconductor chip may be inspected reliably without decreasing sizes and pitches for the probe needles of the probe card.

In example embodiments, the test pad structure for inspecting the semiconductor chip may include nine total test pads 301 that are arranged in total six rows. The nine test pads 301 may form a single block. A plurality of the blocks may be repeatedly arranged in the second direction perpendicular to the first direction.

Figure 5:
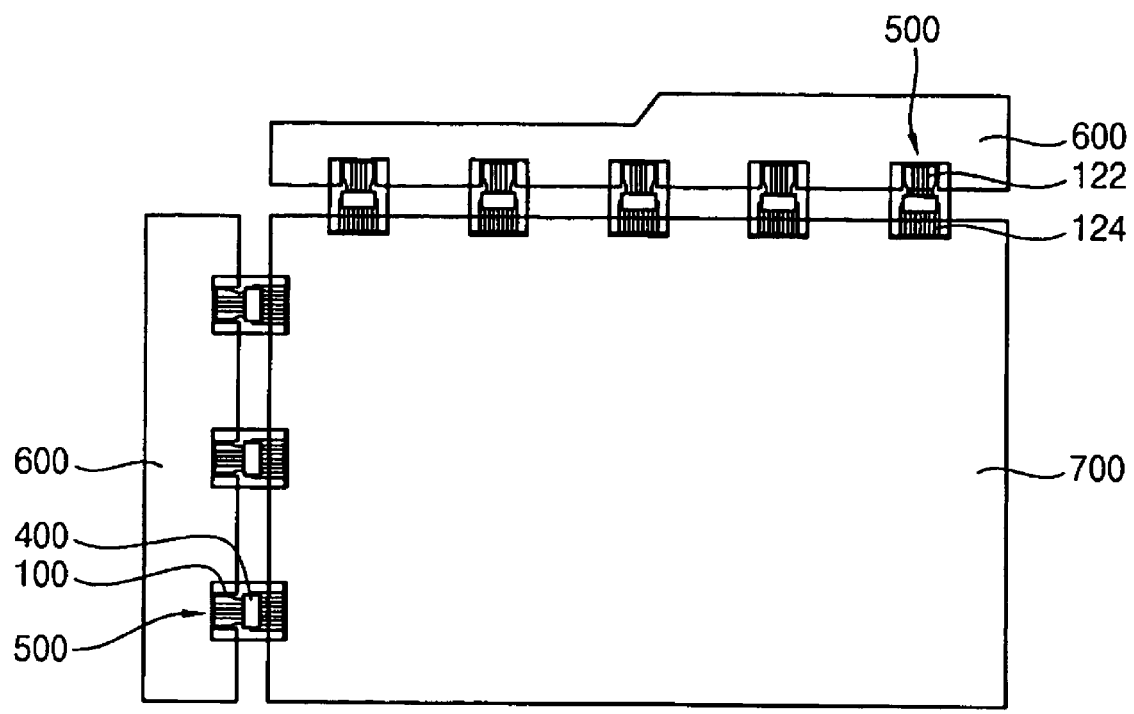

Hereinafter, a display device manufactured using a wiring substrate for a tape package in accordance with example embodiments will be explained. FIG. 5 is a plan view illustrating a display device manufactured using a wiring substrate for a tape package in accordance with example embodiments.

Referring to FIGS. 1 and 5, after a semiconductor chip 400 is mounted on the base film 110, the mounted semiconductor chip 400 may be inspected by the probe card. For example, the semiconductor chip 400 may be mounted on the wiring substrate 100 for a tape package by a flip-chip bonding process. Then, as mentioned above, the probe needles of the probe card may make contact with the test pads to inspect electrical properties of the semiconductor chip 400.

After cutting the test pad region TA of the base film 110 to form a tape package 500, the wiring pattern 120 of the tape package 500 may be electrically connected to a PCB 600 and a display panel 700 to manufacture the display device 1000, e.g., a liquid display device.

For example, the input wirings 122 of the tape package 500 may be electrically connected to the PCB 800. The output wirings 124 of the tape package 500 may be electrically connected to the display panel 700.

The semiconductor chip 400 mounted on the tape package 500 may include driving circuits for driving the display panel 700. For example, the semiconductor chip 400 of the tape package 500 that combines with a first side of the display panel 700 may include a gate driver for driving the gate lines of the display panel 700. The semiconductor chip 400 of the tape package 400 that combines with a second side substantially perpendicular to the first side of the display panel 700 may include a data driver for driving the data lines of the display panel 700.

As mentioned above, a pad structure for inspecting a semiconductor chip in accordance with example embodiments may include at least one inner lead passing between the pads of the second group of the test pads that are arranged in a first row most adjacent to the first group of the test pads to be connected to at least one pad of the second group of the test pads that is arranged in a second row next to the first row.

Accordingly, the pads arranged in the first row may be formed to have the possible maximum size and be spaced apart from each other by a space between which the at least one inner lead may pass. Thus, the semiconductor chip may be inspected reliably without decreasing sizes and pitches for the probe needles of the probe card.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test pad structure, comprising: a plurality of test pads sequentially arranged from a wiring pattern on a substrate and arranged in rows parallel with one another, the plurality of test pads including a first group of test pads having at least one pad arranged in a first row and two pads arranged in rows parallel with the first row, and a second group of test pads having at least two first pads, at least two second pads and at least two third pads, the at least two first pads arranged in a second row parallel with the first row, the at least two second pads arranged in a third row parallel with the first row and the at least two third pads arranged in a fourth row parallel with the first row; and a plurality of connection leads extending from end portions of the wiring pattern to be connected to the plurality of test pads, the plurality of the connection leads including a first group of connection leads connected to the first group of the test pads and a second group of connection leads having first leads, second leads, and third leads, the first leads connected to the at least two first pads, one of the second leads passing between the at least two first pads to be connected to at least one of the at least two second pads, and one of the third leads passing between the at least two first pads to be connected to one of the at least two third pads, the one of the second leads being connected to at least one pad of the at least two second pads arranged in the third row next to the second row, wherein the at least two first pads arranged in the second row are spaced apart from each other by a space required for the one of the second leads, and wherein outer edges of the at least one pad arranged in the first row and the at least two first pads arranged in the second row are contained within outer edges of the at least two second pads arranged in the third row.

2. The test pad structure of claim 1, wherein the at least two pads of the second group arranged in the second row have a first plane area, and the at least two pads of the second group in the third row have a second plane area greater than the first plane area.

3. The test pad structure of claim 1, wherein the second group of the test pads are arranged to be symmetric with respect to a middle line that extends in the direction where the first group of the test pads are arranged.

4. The test pad structure of claim 1, wherein at least one first lead of the first leads comprises: a folded portion inclined from the direction where the first group of the test pads are arranged, the folded portion passing between the first group of the test pads and one pad of the second group of the test pads arranged in the second row.

5. The test pad structure of claim 1, wherein the plurality of test pads are arranged in six rows.

6. The test pad structure of claim 1, further comprising:
a semiconductor chip mounted on the substrate,
wherein the wiring pattern is connected to at least one of input and output pads of the semiconductor chip.

7. The test pad structure of claim 6, wherein the semiconductor chip comprises a driving circuit for driving a display device.

8. A wiring substrate for a tape package, comprising:
a base film including a chip-mounting region, the chip-mounting region configured to mount a semiconductor chip thereon;
a wiring pattern extending from the chip-mounting region to outside the chip-mounting region and configured to electrically connect to the semiconductor chip; and
the test pad structure of claim 1.

9. The method of claim 8, wherein the semiconductor chip comprises a driving circuit for driving a display device.

10. A pad structure for inspecting a semiconductor chip, comprising: a plurality of test pads on a substrate having a semiconductor chip mounted thereon, the plurality of the test pads including a first group of test pads having at least one pad arranged in a first row and two test pads arranged in rows parallel with the first row, and a second group of test pads having at least two first pads, at least two second pads and at least two third pads, the at least two first pads arranged in a second row parallel with the first row, the at least two second pads arranged in a third row parallel with the first row and the at least two third pads arranged in a fourth row parallel with the first row; and a plurality of connection leads on the substrate to connect the plurality of test pads to at least one of input and output pads of the semiconductor chip, the plurality of the connection leads including a first group of connection leads connected to the first group of the test pads and a second group of connection leads having first leads, second leads, and third leads, the first leads connected to the at least two first pads, one of the second leads passing between the at least two first pads to be connected to at least one of the at least two second pads, and one of the third leads passing between the at least two first pads to be connected to one of the at least two third pads, wherein the at least two first pads are spaced apart from each other by a space required for the one of the second leads, and wherein outer edges of the at least one pad arranged in the first row and the at least two first pads arranged in the second row are contained within outer edges of the at least two second pads arranged in the third row.

11. The pad structure for inspecting the semiconductor chip of claim 10, wherein the at least two first pads have a first plane area, and the at least two second pads have a second plane area greater than the first plane area.

12. The pad structure for inspecting the semiconductor chip of claim 10, wherein the second group of the test pads are arranged to be symmetric with respect to a middle line that extends in the direction where the first group of the test pads are arranged.

13. The pad structure for inspecting the semiconductor chip of claim 12, wherein each of the second and third leads comprises a folded portion inclined from the direction where the first group of the test pads are arranged, the folded portion passing between the first group of the test pads and the at least one pad of the second group of pads arranged in the second row.

14. The pad structure for inspecting the semiconductor chip of claim 10, wherein the at least two first pads have a first plane area, the at least two second pads have a second plane area greater than the first plane area and the at least two third pads have a third plane area greater than the second plane area.

15. The pad structure for inspecting the semiconductor chip of claim 10, wherein the first, second and third rows are substantially perpendicular to a direction where the plurality of test pads are arranged.

16. The pad structure for inspecting the semiconductor chip of claim 10, wherein the plurality of the test pads forms a single block and a plurality of the blocks is arranged in a direction perpendicular to the direction where the test pads are arranged.

* * * * *